United States Patent [19]

Rawson et al.

[11] 4,369,524
[45] Jan. 18, 1983

[54] SINGLE COMPONENT TRANSCEIVER DEVICE FOR LINEAR FIBER OPTICAL NETWORK

[75] Inventors: Eric G. Rawson, Saratoga; Donald R. Scifres, Los Altos; Robert D. Burnham, Los Altos Hills, all of Calif.

[73] Assignee: Xerox Corporation, Stamford, Conn.

[21] Appl. No.: 196,714

[22] Filed: Oct. 14, 1980

[51] Int. Cl.³ .............................................. H04B 9/00
[52] U.S. Cl. ..................................... 455/606; 357/19; 357/30; 455/601; 455/607; 455/613
[58] Field of Search ............... 455/606, 607, 613, 601; 357/19, 30

[56] References Cited

U.S. PATENT DOCUMENTS

| | | | |
|---|---|---|---|
| 3,781,092 | 12/1973 | Sussman et al. | 350/266 |
| 3,920,982 | 11/1975 | Harris | 332/7.51 |
| 4,002,896 | 1/1977 | Davies et al. | 332/7.51 |
| 4,052,611 | 10/1977 | Fish | 455/601 |
| 4,195,269 | 3/1980 | Ettenberg et al. | 455/613 |
| 4,217,598 | 8/1980 | d'Auria et al. | 357/19 |
| 4,292,512 | 9/1981 | Miller et al. | 455/613 |

OTHER PUBLICATIONS

Epitaxial Photodetector Catches Optical Signals–Elec. Design, vol. 25, Dec. 6, 1977, p. 102.

*Primary Examiner*—Joseph A. Orsino, Jr.
*Attorney, Agent, or Firm*—Franklyn C. Weiss

[57] ABSTRACT

A single component transceiver device for a linear single fiber optical network which allows both reception and transmission of light information onto a linear data line. One embodiment discloses a light source 10 which would apply modulated light signals, or an unmodulated light carrier, onto an optical medium at the end 12 thereof. This light would reach point 14 along the optical fiber and be detected and/or further modulated by diode 16 and this light information is introduced unidirectionally onto the optical fiber. A second embodiment would include a diode 52 along an optical fiber which would detect and/or radiate light signals bidirectionally along an optical fiber. A proposed light transceiver 90 which could be utilized with the above two embodiments is also disclosed.

5 Claims, 3 Drawing Figures

SINGLE COMPONENT TRANSCEIVER DEVICE FOR LINEAR FIBER OPTICAL NETWORK

The invention relates to a single component transceiver device for linear fiber optical network; the transceiver allows both reception and transmission of light information from and onto a linear data line comprised of a single optical fiber.

BACKGROUND OF THE INVENTION

In an article entitled "Epitaxial Photodetector Catches Optical Signals", published in *Electronic Design*, Volume 25, Page 102 (Dec. 6, 1977), AEG-Telefunken has described an epitaxial GaAlAs (gallium-aluminum arsenide) detector which has holes etched in the top and bottom thereof to permit the two ends of an optical fiber data line to be inserted and cemented. The article indicates that a transparent photodetector can provide a simple means of picking off optical signals in the middle of a fiber optic data link. Further, signals can be picked off more easily than by using an optical branching unit or by breaking a fiber and inserting a detector along with an amplifier for driving a second light source to relaunch the signals. Notwithstanding this article, however, it is sometimes necessary and important to insert, or inject, information onto the data line as well as monitor the data on the line.

This prior art discloses that the transmission efficiency of the detector approaches 70% and that the layers between the fiber ends are less than 10 micrometers thick, providing useful through transmission. The ability to inject as well as monitor data would greatly increase the potential usefulness of such a device. According to the present invention, an epitaxial GaAlAs detector/LED transceiver is disclosed which includes modulation of a light beam injected at one end of the data line or by LED (Light Emitting Diode) injection of a light signal.

DESCRIPTION OF THE DRAWINGS

For a more complete understanding of the invention, reference may be had to the following detailed description of the invention in conjunction with the drawings wherein.

DETAILED DESCRIPTION OF THE INVENTION

Copending application Ser. No. 043,391, now U.S. Pat. No. 4,233,589, issued Nov. 11, 1980, discloses an active T-coupler for fiber optical local networks which permits collision detection for use as an optical repeater or to transmit originally generated light signals in both the forward and reverse directions. Further, electrical signals from the input detectors can be monitored to detect the occurrence of a data collision while transmitting and thereby react appropriately. The present invention can be operated in a similar environment where signals are transmitted and detected in a fiber optic network.

The light source/detector herein also involves the use of a gallium aluminum arsenide light emitting detector/generator. The use of GaAlAs as a light emitting source was disclosed in 1962. However, for a discussion of laser diode devices in a fiber optic data transmission environment, reference is made to copending applications Ser. No. 056,765 and Ser. No. 076,633.

Figure 1:
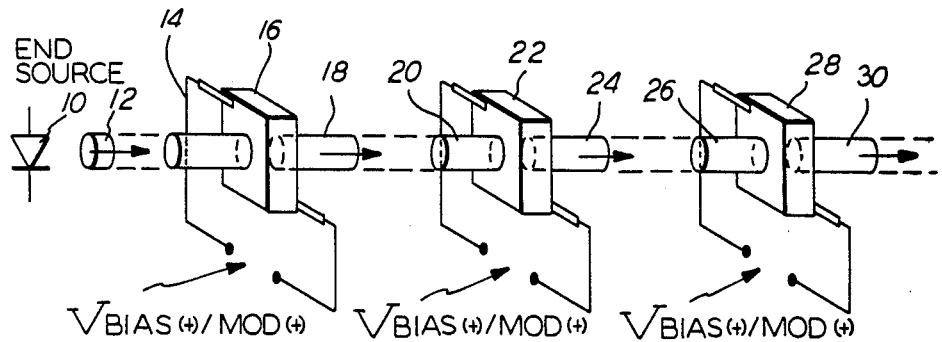
FIG. 1 is a block diagram of a linear fiber optical network depicting transmission by modulation of a carrier beam in accordance with the present invention.

FIG. 1 of the present invention discloses the unidirectional transmission of information in an optical fiber network by the modulation of a carrier beam of light as from an LED or laser at the transmitting end of the system. That is, a light source 10, such as a modulated or unmodulated LED, would apply modulated or unmodulated light onto the optical medium at the end thereof 12. This light would reach point 14 in the optical fiber and be detected and/or further modulated by the detector/modulator 16 and this light information is reintroduced into end 18 of the optical fiber. Further detection and/or modulation of the transmitted light can be accomplished by detector/modulator 22 and 28 when the light is received at ends 20 and 26, and reintroduced at ends 24 and 30, respectively, of the optical light medium.

It is known that the absorption edge for GaAlAs is very abrupt and can be shifted (sufficiently to modulate a transmitted beam to a useful degree) by varying the applied back-bias voltage across the light emitting diode. Thus, for reception of light, as by diodes 16, 22, or 28, a constant back-bias voltage V sufficient to provide a useful detected signal would be applied. For transmission of light, this back-bias voltage would be modulated, by any known means and methods, so as to shift the absorption edge back and forth across the wavelength of the light source at the end of the data line. Thus, all stations downstream from the transmitting station can monitor the transmitted light. Thus, for instance, detector/modulator 16 could monitor and retransmit unmodulated the light generated by source 10. Detector/modulator 22 could, for example, modulate the received light, transmit it down the line where detector/modulator 28 could monitor and/or modulate this light information. A second similar line would carry data in the opposite direction.

Figure 2:
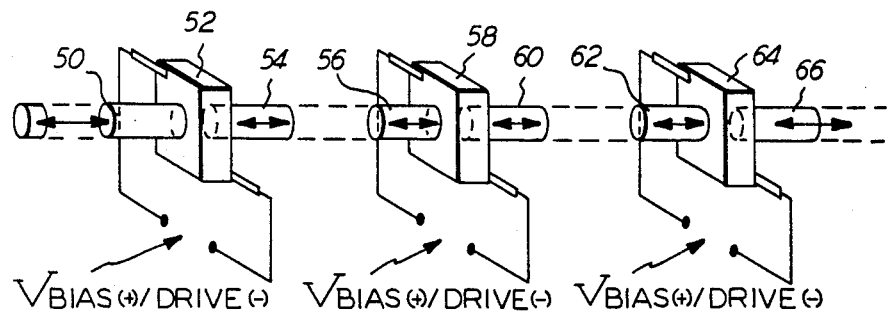
FIG. 2 is a block diagram of a linear fiber optical network depicting transmission by LED light signal injection in accordance with the invention.

FIG. 2 discloses a system similar to that of FIG. 1, only the diode device can transmit the light generated therein in either direction. Thus, detectors/LEDS 52, 58, 64 in response to the applied bias voltage will generate light and introduce it into the optical fiber medium in both directions at points 50, 54 and 56, 60 and 62, 66 respectively. The detector/modulator LED devices 52, 58, 64 in FIG. 2 could be similar to that described in the AEG-Telefunken article discussed above. Thus, a GaAlAs doubleheterostructure similar to that shown in the AEG-Telefunken article would serve not only with back-bias as a detector, as taught in the article, but also as an LED, with appropriate forward bias across the diode. Modulation of the resulting forward current across the diode by any of the known means and methods would serve to inject a modulated light signal which travels bi-directionally in the optical medium, as discussed above in conjunction with FIG. 2.

Figure 3:
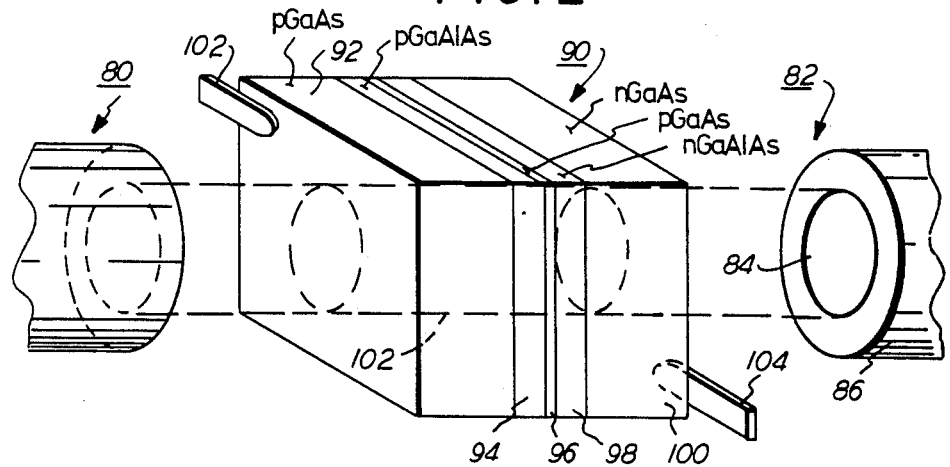
FIG. 3 is a schematic representation of GaAlAs detector/LED transceiver with wave guiding provisions in accordance with the invention.

FIG. 3 shows a detector/LED/modulator device which could be utilized in conjunction with FIGS. 1 and 2. The device is similar to that described in conjunction with the AEG-Telefunken article, but includes the added teaching of a waveguide channel between the ends of the input optical fibers to limit signal and amplitude loss without the necessity of etching holes for the fibers themselves.

Optical fibers 80 and 82 include the fiber core 84 and the fiber cladding 86, as is well known. The optical fibers would fit flush against the device 90 rather than inserted and cemented. The device 90 would include a first thicker layer 92 made of p-type gallium arsenide (pGaAs). The second layer 94 would comprise p-type gallium aluminum arsenide (pGaAlAs). The third layer 96 is p-type gallium arsenide (pGaAs). The fourth layer 98 comprises n-type gallium aluminum arsenide (nGaAlAs); while the final, thicker layer 100 is n-type gallium arsenide (nGaAs). Electrodes 102, 104 would be attached to the device 90 on the outside of layers 92 and 100, respectively. Thus, light travelling on optical fiber 80 could be detected or modulated in conjunction with the invention described in FIG. 1. Light could be generated on the optical fibers 80, 82 in conjunction with the invention described in FIG. 2.

Thus, it is shown that the requirement to make the internal device layers very thin (less than ten micrometers as set forth in the AEG-Telefunken article) in order to avoid excessive beam spreading in the detector and thereby achieve good coupling between the two fiber ends can be eliminated by creating the cylindrical region 102 within device 90 with a higher refractive index inside than outside so that the volume between the fiber cores 84 acts like a waveguide of numerical aperture at least comparable to that of the fibers 80 and 82. Such a waveguiding channel between the fiber ends limits the losses to those due to reflection and absorption of the light. Of course, the reflection losses at the fiber-device interfaces could be substantially eliminated with the use of appropriate anti-reflection coatings on either the two faces of the transceiver device 90, or on the two end faces of the fibers 80 and 82. The absorption loss is bias-adjustable and is directly related to the fraction of the light which it is desired to tap. The ability of the transceiver device 90 to waveguide in this manner also allows an additional degree of freedom in selecting optimal layer thickness and reduces manufacturing costs by eliminating the need for the etching process steps. Such an optically guiding refractive index profile might be produced by masked diffusion of zinc into the p-side of the device and sulphur into the n-side of the device, or by controlled deposition during fabrication by molecular beam epitaxy, or chemical vapor deposition.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. An optical fiber data transmission system including a modulated light source (10) for introducing a modulated or unmodulated carrier beam of light into said optical fiber (12) wherein the improvement is characterized by:

diode means (16) inserted along said optical fiber for detecting the modulated light on said optical fiber or further modulating said light on said optical fiber depending on the applied bias voltage to said diode means, wherein for detection of light by said diode means a constant back-bias voltage sufficient to provide a useful detected signal would be applied, and for modulation of a carrier beam of light the back-bias voltage is modulated so as to shift the absorption edge of the diode means back and forth across the wavelength of the light source (10), said diode means comprising a first thick layer (92) of p-type gallium arsenide, a second thin layer (94) of p-type gallium aluminum arsenide, a third thin layer (96) of p-type gallium arsenide, a fourth thin layer (98) of n-type gallium aluminum arsenide, and a fifth thick layer (100) of n-type gallium arsenide, and further including a cylindrical region (102) through said first, second, third, fourth, and fifth layers of higher refractive index inside said cylindrical region than outside said region so as to provide a light waveguide channel through the diode means.

2. A diode type (90) transceiver wherein the improvement is characterized by:

a first thick layer (92) of p-type gallium arsenide, a second thin layer (94) of p-type gallium aluminum arsenide, a third thin layer (96) of p-type gallium arsenide, a fourth thin layer (98) of n-type gallium aluminum arsenide, a fifth thick layer (100) of n-type gallium arsenide, and a cylindrical region (102) through said first, second, third, fourth, and fifth layers of higher refractive index inside said cylindrical region than outside said region so as to provide a light waveguide channel through the transceiver.

3. The diode type transceiver as set forth in claim 2 wherein the cylindrical region (102) thereof is the same approximate diameter as the cores of input and output optical fibers applied thereto in an optical fiber data transmission system.

4. The diode type transceiver as set forth in claim 3 wherein said cylindrical region (102) is formed during fabrication of the transceiver by masked diffusion of zinc into the p-type areas of the transceiver and sulphur into the n-type areas of the transceiver.

5. An optical fiber data transmission system including diode means (52) inserted along said optical fiber (50), each said diode means comprising an epitaxial structure double-heterostructure gallium arsenide device, wherein the improvement is characterized by:

said diode means being inserted along said optical fiber for detection of light on said optical fiber from either direction and for introducing light signals generated thereby in both directions in said fiber, wherein for detection of light on said optical fiber by said diode means a constant back-bias voltage sufficient to provide a useful detected signal would be applied, and for radiation of the light signals onto said optical fiber a modulated forward bias voltage is applied so as to inject a modulated light signal bi-directionally onto said optical fiber, said diode means comprising a first thick layer (92) of p-type gallium arsenide, a second thin layer (94) of p-type gallium aluminum arsenide, a third thin layer (96) of p-type gallium arsenide, a fourth thin layer (98) of n-type gallium aluminum arsenide, and a fifth thick layer (100) of n-type gallium arsenide, said diode means further including a cylindrical region (102) through said first, second, third, fourth, and fifth layers of higher refractive index inside said cylindrical region than outside said region so as to provide a light waveguide channel through the diode means.

* * * * *